United States Patent
Zhuang et al.

(10) Patent No.: US 7,402,456 B2
(45) Date of Patent: Jul. 22, 2008

(54) PCMO THIN FILM WITH MEMORY RESISTANCE PROPERTIES

(75) Inventors: Wei-Wei Zhuang, Vancouver, WA (US); Tingkai Li, Vancouver, WA (US); Sheng Teng Hsu, Camas, WA (US); Fengyan Zhang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/831,677

(22) Filed: Apr. 23, 2004

(65) Prior Publication Data

US 2005/0239262 A1    Oct. 27, 2005

(51) Int. Cl.
H01L 21/44    (2006.01)

(52) U.S. Cl. .............. 438/100; 438/104; 257/E27.006

(58) Field of Classification Search ............ 438/3, 438/381–382, 384–385, 210, 238, 100–101, 438/104; 257/E27.006
See application file for complete search history.

(56) References Cited

U.S. PATENT DOCUMENTS

| | | | |
|---|---|---|---|
| 6,204,139 B1 | 3/2001 | Liu et al. | 438/385 |
| 6,673,691 B2 | 1/2004 | Zhuang et al. | 438/382 |
| 6,762,481 B2* | 7/2004 | Liu et al. | 257/595 |
| 6,774,054 B1* | 8/2004 | Zhang et al. | 438/781 |
| 6,849,891 B1* | 2/2005 | Hsu et al. | 257/296 |
| 6,911,361 B2* | 6/2005 | Zhang et al. | 438/240 |
| 6,972,239 B1* | 12/2005 | Li et al. | 438/384 |
| 7,098,101 B1* | 8/2006 | Li et al. | 438/238 |
| 7,189,569 B2* | 3/2007 | Rinerson et al. | 438/3 |
| 2003/0148545 A1* | 8/2003 | Zhunag et al. | 438/3 |
| 2003/0156445 A1* | 8/2003 | Zhuang et al. | 365/148 |
| 2004/0121074 A1* | 6/2004 | Zhuang et al. | 427/255.32 |
| 2004/0235247 A1* | 11/2004 | Hsu et al. | 438/257 |
| 2005/0037520 A1* | 2/2005 | Zhuang et al. | 438/3 |
| 2005/0145910 A1* | 7/2005 | Tamai et al. | 257/296 |
| 2005/0151277 A1* | 7/2005 | Kawazoe et al. | 257/904 |
| 2005/0207265 A1* | 9/2005 | Hsu et al. | 365/232 |
| 2005/0245039 A1* | 11/2005 | Li et al. | 438/385 |
| 2005/0270821 A1* | 12/2005 | Nakano | 365/145 |
| 2005/0275064 A1* | 12/2005 | Li et al. | 257/565 |
| 2006/0108625 A1* | 5/2006 | Lee et al. | 257/310 |
| 2006/0154417 A1* | 7/2006 | Shinmura et al. | 438/240 |

OTHER PUBLICATIONS

Shangqing Liu, Naijuan Wu and Alex Ignatiev, *Applied Physics Letters*, vol. 76, No. 19, pp. 2749, May 2000.

* cited by examiner

*Primary Examiner*—Ida M. Soward
*Assistant Examiner*—Toniae M Thomas
(74) *Attorney, Agent, or Firm*—Law Office of Gerald Maliszewski; Gerald Maliszewski

(57) ABSTRACT

A method is provided for forming a $Pr_{0.3}Ca_{0.7}MnO_3$ (PCMO) thin film with crystalline structure-related memory resistance properties. The method comprises: forming a PCMO thin film with a first crystalline structure; and, changing the resistance state of the PCMO film using pulse polarities responsive to the first crystalline structure. In one aspect the first crystalline structure is either amorphous or a weak-crystalline. Then, the resistance state of the PCMO film is changed in response to unipolar pulses. In another aspect, the PCMO thin film has either a polycrystalline structure. Then, the resistance state of the PCMO film changes in response to bipolar pulses.

12 Claims, 6 Drawing Sheets

PCMO THIN FILM WITH MEMORY RESISTANCE PROPERTIES

BACKGROUND OF THE INVENTION

1. Field of the Invention

This invention generally relates to integrated circuit (IC) memory devices and, more particularly, to a PCMO thin film with memory properties responsive to crystalline structure.

2. Description of the Related Art $Pr_{0.3}Ca_{0.7}MnO_3$ (PCMO) metal oxide thin films, which show reversible resistance change responsive to bipolar electrical pulses applied at room temperature, have been grown on both epitaxial $YBa_2Cu_3O_7$ (YBCO) and partial epitaxial Pt substrates using a pulsed laser deposition (PLD) technique. In U.S. Pat. No. 6,673,691, invented by Zhuang and Hsu, a spin-coat PCMO thin film deposition method is disclosed that results in a PCMO film with reversible resistance characteristics, responsive to unipolar electrical pulses.

The observed change in resistance states is in the range of one to three orders of magnitude. These characteristics make PCMO well suited for use in memory cells and resistor RAM (RRAM) applications. These memory cell devices typically employ at least one electrode made, at least partially, from a noble metal, adjacently located to the PCMO memory resistor material.

There are many methods used for PCMO thin film deposition, such as physical vapor deposition (PVD), metalorganic chemical vapor deposition (MOCVD), and spin-coating. Of the three, spin-coating is one of the best candidates for the large scale manufacturing, as it is a relatively low cost, easy process.

It would be advantageous if the relationship between pulse polarities and PCMO thin film characteristics could be exploited.

It would be advantageous if the pulse polarity needed to change resistance states in a PCMO thin film could be selected in response to properties of the film.

SUMMARY OF THE INVENTION

The present invention discloses a PCMO thin film with reversible resistance switching properties, responsive to either unipolar or bipolar electrical pulses, based upon the thin film deposition method and its crystalline structure. Unipolar switching is associated with a weak polycrystalline PCMO thin film. Bipolar switching behavior results from a polycrystalline PCMO thin film.

Accordingly, a method is provided for forming a $Pr_{0.3}Ca_{0.7}MnO_3$ (PCMO) thin film with crystalline structure-related memory resistance properties. The method comprises: forming a PCMO thin film with a first crystalline structure; and, changing the resistance state of the PCMO film using pulse polarities responsive to the first crystalline structure. In one aspect the first crystalline structure is either amorphous or a weak-crystalline. Then, the resistance state of the PCMO film is changed in response to unipolar pulses.

For example, changing the resistance state of the PCMO film in response to unipolar pulses includes: writing a high resistance state, of 60 kilo-ohms to 10 megaohms, in response to a pulse having an amplitude in the range of 2 to 10 volts (V), and a pulse duration of in the range of 10 to 1000 nanoseconds (ns); and, resetting to a low resistance state, of 0.5 to 50 kilo-ohms, in response to a pulse having an amplitude in the range of 2 to 5V, and a pulse duration in the range of 1.5 microseconds (µs) to 10 milliseconds (ms).

In another aspect, the PCMO thin film has a polycrystalline structure. Then, the resistance state of the PCMO film changes in response to bipolar pulses. For example, changing the resistance state of a polycrystalline PCMO film in response to bipolar pulses includes: writing a high resistance state, of greater than 300 kilo-ohms, in response to a pulse having an amplitude of 5 volts (V), or less, and a pulse duration of 1 ms, or less; and, resetting to a low resistance state, of less than 5 kilo-ohms, in response to a pulse having an amplitude of −5V, or greater, and a pulse duration of 1 ms, or less.

Additional details of the above-described method and a PCMO device with crystalline structure-related memory properties are provided below.

DETAILED DESCRIPTION OF THE PREFERRED EMBODIMENTS

Figure 1A:
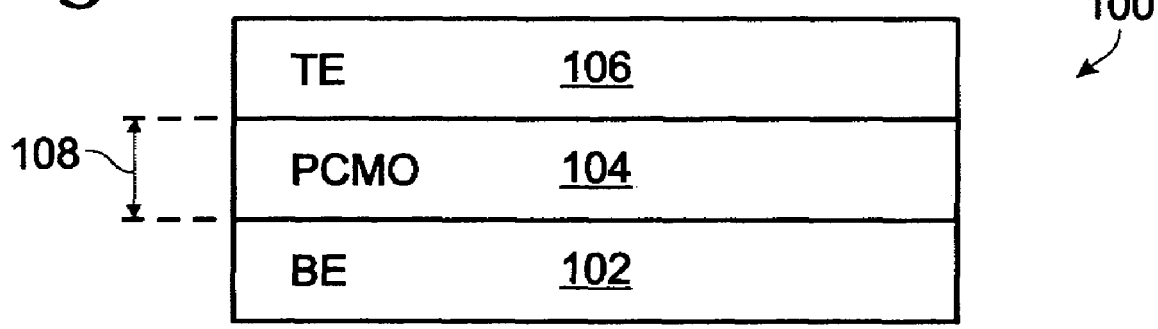
FIG. 1A is a partial cross-sectional view of the present invention $Pr_{0.3}Ca_{0.7}MnO_3$ (PCMO) device with crystalline structure-related memory resistance properties.

FIG. 1A is a partial cross-sectional view of the present invention $Pr_{0.3}Ca_{0.7}MnO_3$ (PCMO) device with crystalline structure-related memory resistance properties. The device 100 comprises a bottom electrode (BE) 102 and a PCMO thin film 104 with a first crystalline structure overlying the bottom electrode 102. The PCMO film 104 has a resistance state that is selected using pulse polarities responsive to the first crystalline structure. A top electrode (TE) 106 overlies the PCMO film 104. The PCMO film 104 has a thickness 108 in the range of about 300 to 10,000 Å. The bottom and top electrodes 102/106 may be formed from any conventional electrode material, such as a noble metal material.

In one aspect, the PCMO thin film 104 has a first crystalline structure that is either amorphous or a weak-crystalline structure. Then, the resistance state of the PCMO film 104 is selected in response to unipolar pulses. For example, the PCMO film 104 can be written to a high resistance state in response to a pulse having an amplitude in the range of 2 to 10 volts (V), and a pulse duration of in the range of 10 to 1000 nanoseconds (ns). The PCMO film 104 can be reset to a low resistance state in response to a pulse having an amplitude in the range of 2 to 5V, and a pulse duration in the range of 1.5 microseconds (µs) to 10 milliseconds (ms). The PCMO film 104 has a high resistance in the range of about 60 kilo-ohms (k-ohms) to 10 megaohms, and a low resistance in the range of about 0.5 to 50 k-ohms.

More particularly, if the PCMO thin film 104 first crystalline structure is amorphous, then the amorphous PCMO film has a high resistance of greater than about 60 k-ohms, using a 5 V pulse of 100 ns. The amorphous PCMO film 104 has a low resistance of less than about 50 k-ohms, using a 3 V pulse of 10 µs.

Figure 1B:
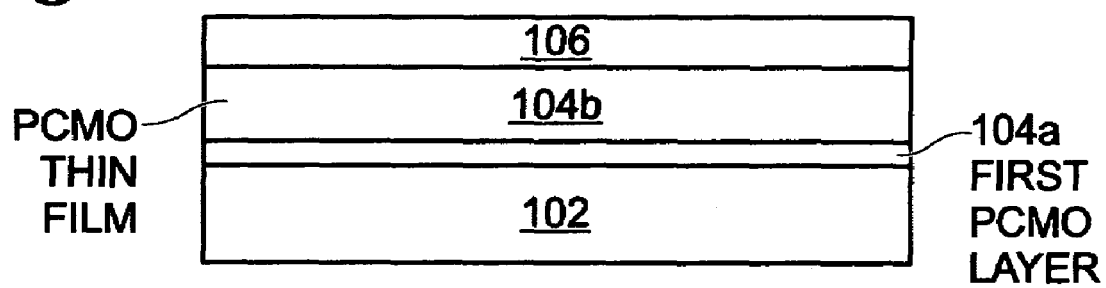
FIG. 1B is a partial cross-sectional view of the present invention weak-crystalline PCMO device.

FIG. 1B is a partial cross-sectional view of the present invention weak-crystalline PCMO device. The weak-crystalline PCMO device may be formed from a first, polycrystalline seed layer of PCMO film 104a overlying the bottom electrode 102. A second, amorphous layer of PCMO thin film 104b overlies the first PCMO film 104a. The amorphous thin film 104b may be formed by spin-coating, for example. In one aspect, the second PCMO layer 104b is formed by three spin-coat layers. Overall, the combination of the PCMO thin film layers 104a and 104b results in a first crystalline structure 104a/104b that is weak-crystalline. The weak-crystalline PCMO film 104a/104b has a high resistance state of greater than about 60 k-ohms, using a 5 V pulse of 100 ns. The weak-crystalline PCMO film 104a/104b has a low resistance of less than about 50 k-ohms using a 3 V pulse of 10 µs.

Returning to FIG. 1A, in a different aspect, the PCMO thin film 104 first crystalline structure is a polycrystalline structure, and the resistance of the PCMO film is selected in response to bipolar pulses. For example, a polycrystalline PCMO film 104 can be written to a high resistance state in response to a pulse having an amplitude of 5 V, or less, and a pulse duration of 1 ms, or less. The polycrystalline PCMO film 104 can be reset to a low resistance state in response to a pulse having an amplitude of −5 V, or greater, and a pulse duration of 1 ms, or less. The polycrystalline PCMO film 104 has a high resistance of greater than about 300 k-ohms and a low resistance of less than about 5 k-ohms.

As used herein, amorphous is defined as a crystalline structure where the atoms in a molecular cell are not regularly arranged. The atoms of glass are one example of an amorphous structure. An X-ray diffraction (XRD) of an amorphous sample shows no clear peak around 2θ=32°. In a weak-crystalline structure the atoms in a molecular cell are regularly arranged on an average of only 10%, or less. An XRD of such a structure shows only a weak peak at 2θ=32°. A polycrystalline structure is well crystallized, but the crystallization occurs in different orientations. An XRD shows a clear peak at 2θ=32°. More particularly (see FIGS. 3, 5, and 7), no counts/s are observed in the amorphous case, 100 counts/s are observed with weak-crystalline PCMO, and 2000 counts/s are observed with polycrystalline PCMO. Alternately stated, a 200% count increase is observed in comparing polycrystalline PCMO to weak-crystalline PCMO.

FUNCTIONAL DESCRIPTION

The crystallization structure of PCMO thin films has a direct effect upon the thin film electrical properties and the method used to induce the thin film reversible resistance switches. Amorphous and weak-crystalline PCMO thin films have reversible resistance switch properties that are induced using unipolar electric pulses. Relatively short electrical pulses are used to write (set high resistance state), and long electrical pulses are used to reset (set to a low resistance). Highly-crystalline PCMO thin films have reversible resistance switch properties that are induced using short bipolar electrical pulses. If the PCMO thin film has a polycrystalline structure, between weak and highly crystalline structures, then stable reversible resistance switches can be induced using short negative electric pulse and long positive electric pulse.

The following examples help illustrate the invention:

EXAMPLE ONE

A PCMO thin film was prepared using a spin-coating process. The thickness of the thin film was 2500 Å, as identified by a scanning electron microscope (SEM). The thin film composition was $Pr_{0.7}Ca_{0.3}MnO_3$. The resistance was measured using an HP-4145B semiconductor analyzer, and the electric pulse was generated from a pulse generator. Stable reversible resistance switches were obtained by using unipolar electric pulses: 5V/100 ns for writing the resistance to a high state, and 3V/10 µs to reset the resistance to a low state.

Figure 2:
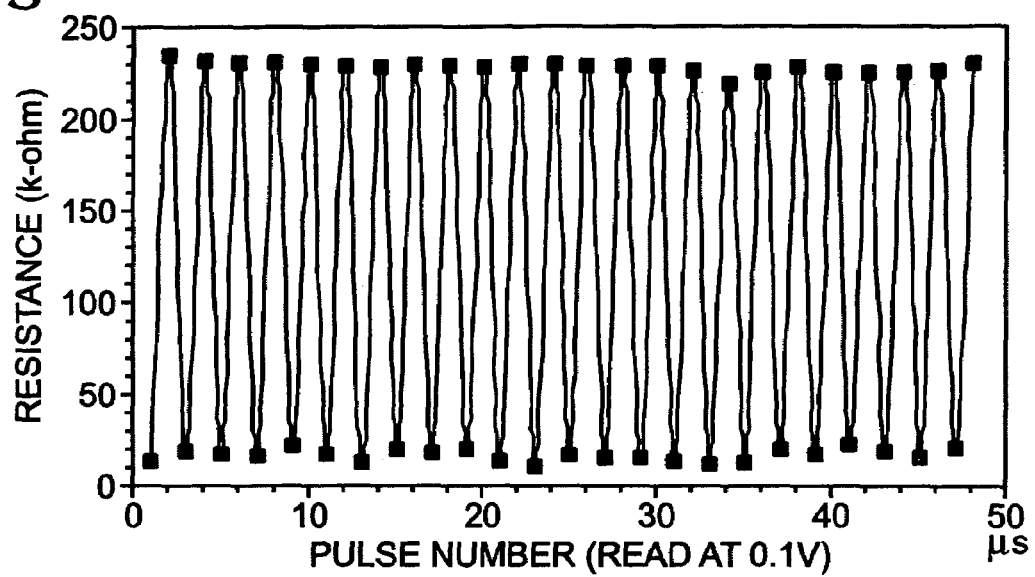
FIG. 2 is a graph illustrating the switching characteristics of the PCMO film of Example One.

FIG. 2 is a graph illustrating the switching characteristics of the PCMO film of Example One.

Figure 3:
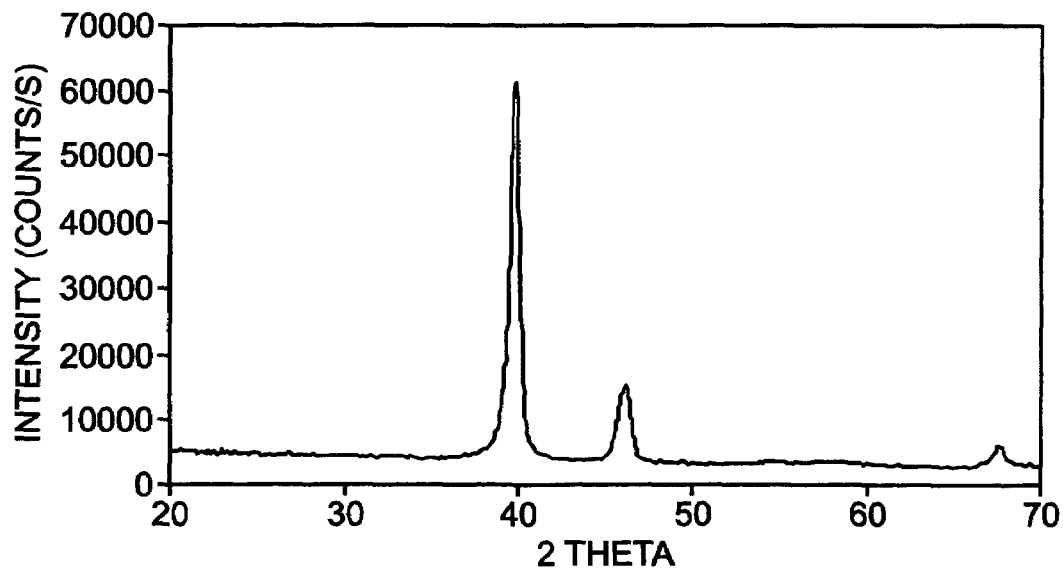
FIG. 3 is an XRD spectrum of the PCMO thin film of Example One.

FIG. 3 is an XRD spectrum of the PCMO thin film of Example One. The figure indicates that the thin film is in an amorphous or micro-polycrystalline state.

EXAMPLE TWO

The PCMO thin film of Example Two was deposited by a metal organic chemical vapor deposition (MOCVD) method. Reversible resistance switches were induced by using negative electrical pulses to write the resistance to a high state, and positive electrical pulses to reset the resistance to a low state.

Figure 4:
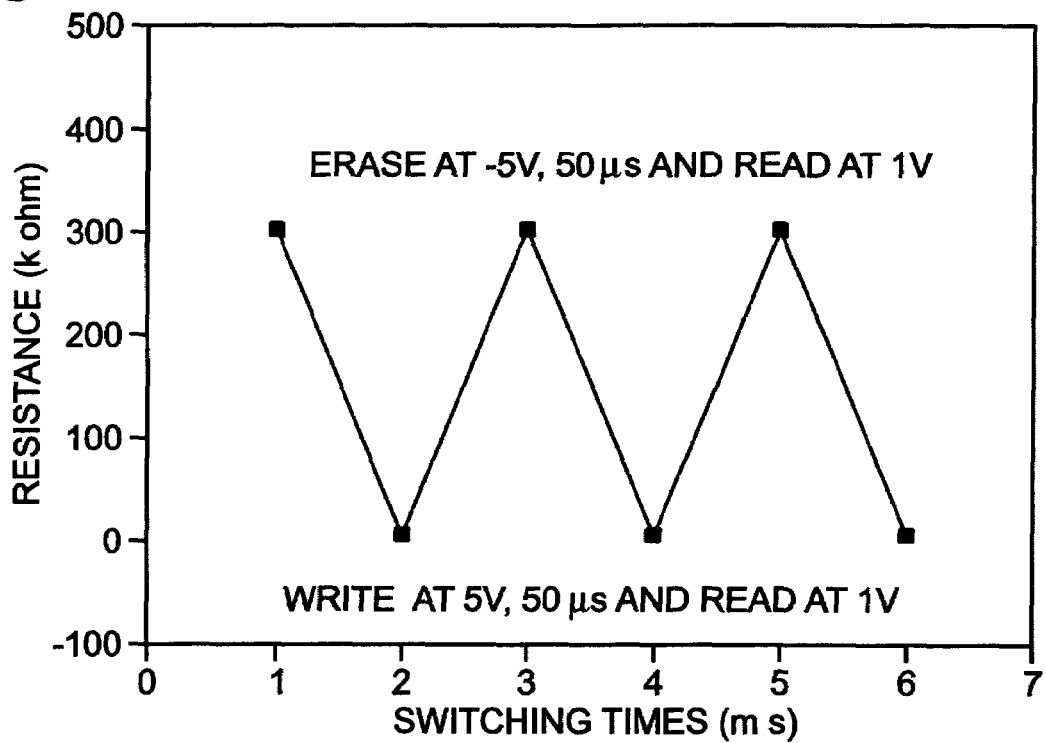
FIG. 4 is a diagram illustrating the switching characteristics of the PCMO thin film of Example Two.

FIG. 4 is a diagram illustrating the switching characteristics of the PCMO thin film of Example Two.

Figure 5:
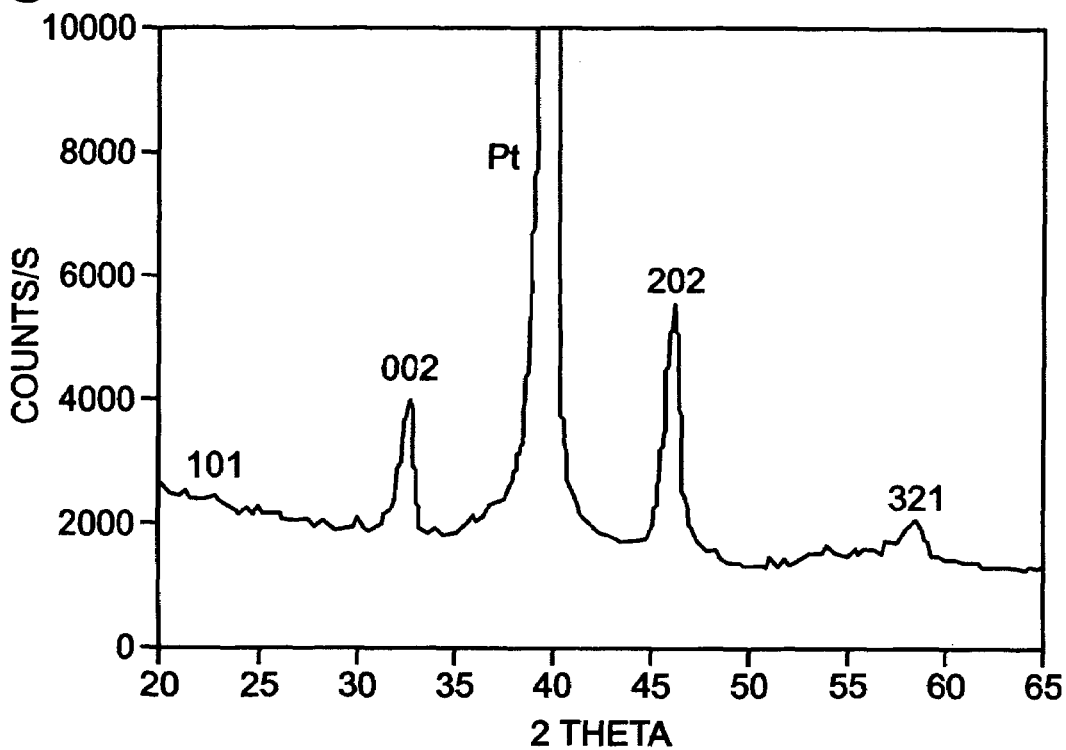
FIG. 5 is an XRD of the PCMO thin film of Example Two.

FIG. 5 is an XRD of the PCMO thin film of Example Two. The XRD shows a polycrystalline PCMO thin film structure.

EXAMPLE THREE

The PCMO thin film of Example Three was deposited by, first, using MOCVD process to a thin seed layer in the thickness of 200 Å. Then, three layers of PCMO thin films were deposited by spin-coating. The resultant PCMO thin film thickness is 2500 Å.

Figure 6:
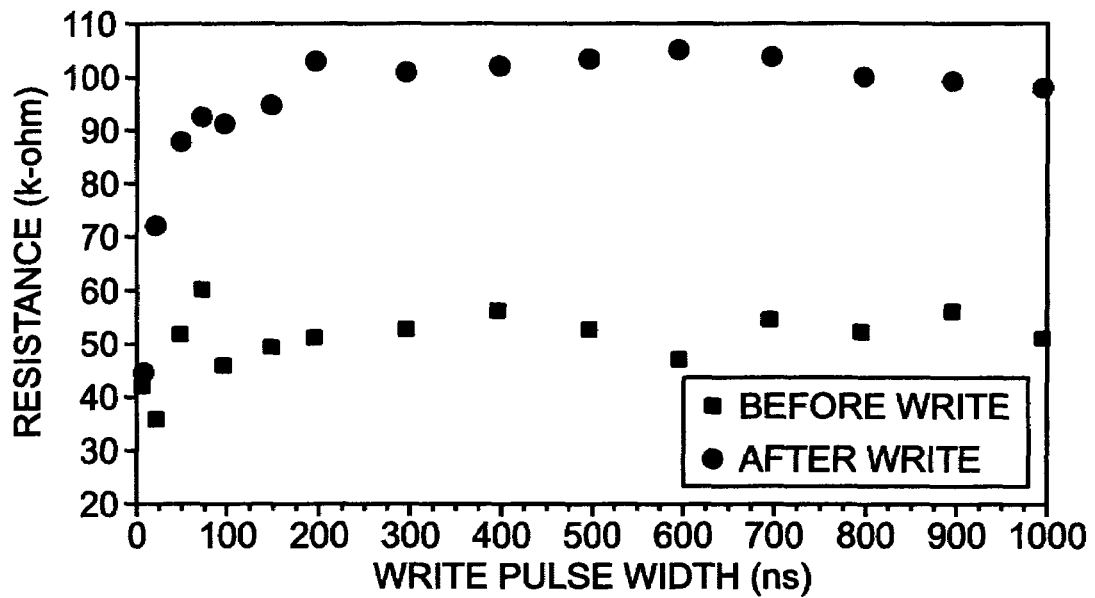
FIG. 6 is a diagram illustrating the switching characteristics of the PCMO film of Example 3.

FIG. 6 is a diagram illustrating the switching characteristics of the PCMO film of Example 3. As shown, stable reversible resistance switches were observed by using negative short electrical pulses (−5V/100 ns) to write the resistance to a high state. Long positive electrical pulses (4V/10 µs) were used to reset the resistance to a low state.

Figure 7:
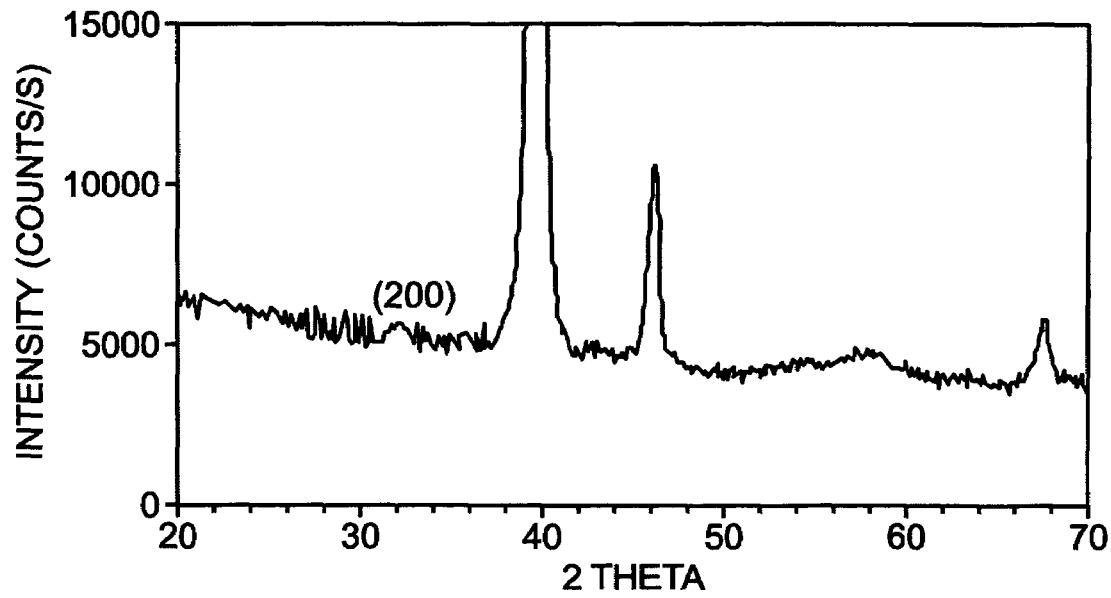
FIG. 7 is an XRD of the PCMO film of Example Three.

FIG. 7 is an XRD of the PCMO film of Example Three. The XRD shows a weak [200] peak, which indicates a weak-crystalline state.

Figure 8:
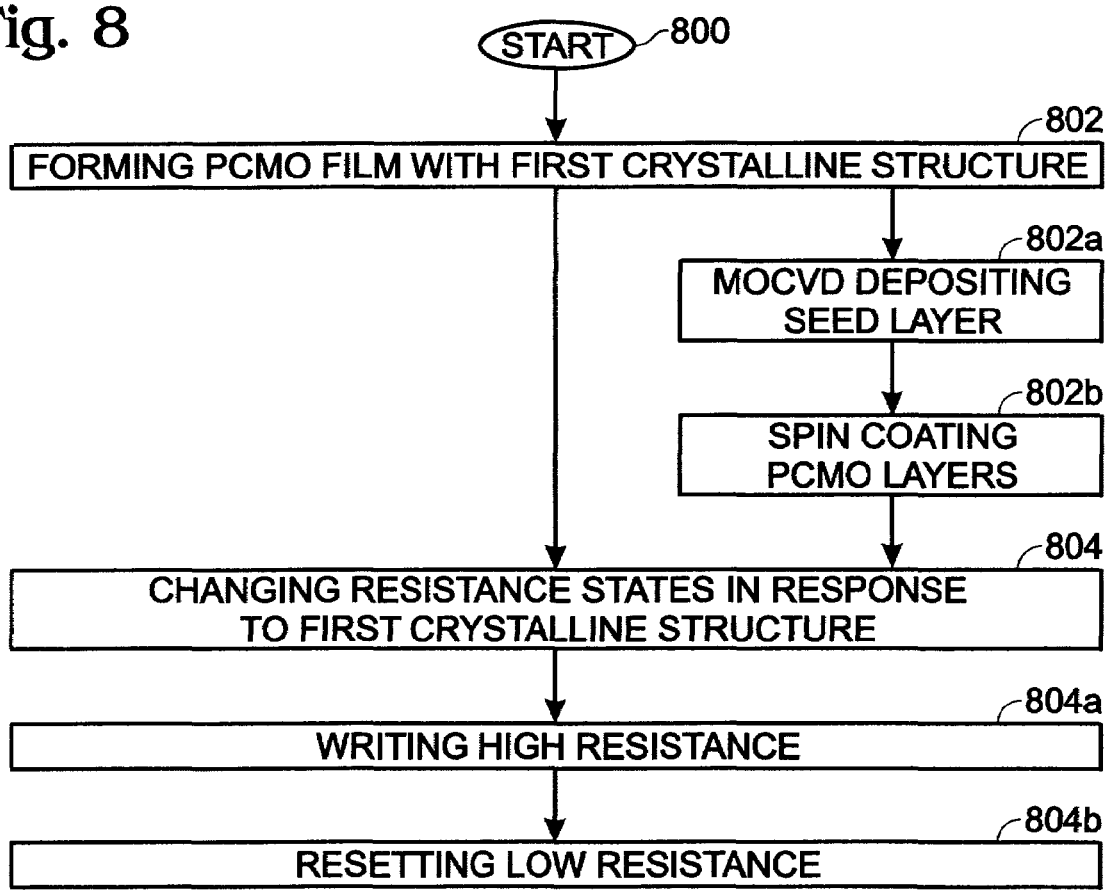
FIG. 8 is a flowchart illustrating the present invention method for forming a PCMO thin film with crystalline structure-related memory resistance properties.

FIG. 8 is a flowchart illustrating the present invention method for forming a PCMO thin film with crystalline structure-related memory resistance properties. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800.

Step 802 forms a PCMO thin film with a first crystalline structure. Step 804 changes the resistance state of the PCMO film using pulse polarities responsive to the first crystalline structure.

In one aspect, forming a PCMO thin film with a first crystalline structure in Step 802 includes forming a PCMO thin film with a first crystalline structure that is either amorphous or weak-crystalline. Then, changing the resistance state of the PCMO film using pulse polarities responsive to the first crystalline structure in Step 804 includes changing the resistance state of the PCMO film in response to unipolar pulses.

For example, changing the resistance state of the PCMO film in response to unipolar pulses includes substeps. Step 804a writes a high resistance state in response to a pulse having an amplitude in the range of 2 to 10 volts (V), and a pulse duration of in the range of 10 to 1000 nanoseconds (ns). Step 804b resets to a low resistance state in response to a pulse having an amplitude in the range of 2 to 5V, and a pulse duration in the range of 1.5 microseconds (μs) to 10 milliseconds (ms). In one aspect, Step 804a writes a resistance in the range of about 60 kilo-ohms (k-ohms) to 10 megaohms, and Step 804b resets to a resistance in the range of about 0.5 to 50 k-ohms.

More particularly, if the PCMO film has an amorphous first crystalline structure, then Step 802 spin-coats a PCMO film having a thickness of 2500 Å, or greater. Step 804a may write a resistance of greater than about 60 k-ohms, using a 5 V pulse of 100 ns. Step 804b may reset to a resistance of less than about 50 k-ohms, using a 3 V pulse of 10 μs.

If the PCMO film has a weak-crystalline first crystalline structure, then Step 802 may include substeps. Step 802a uses a MOCVD process to deposit a polycrystalline seed layer of PCMO having a thickness of about 200 Å. Step 802b spin-coats a plurality of PCMO layers, having a combined thickness of about 2500 Å, overlying the seed layer. Then, Step 804a may write a resistance of greater than about 60 k-ohms, using a 5 V pulse of 100 ns, and Step 804b may reset to a resistance of less than about 50 k-ohms using a 3 V pulse of 10 μs.

In a different aspect, forming a PCMO thin film in Step 802 includes forming a PCMO thin film with a first crystalline structure that is polycrystalline. Then, Step 804 changes the resistance state of the PCMO film in response to bipolar pulses.

If the PCMO thin film has a polycrystalline first crystalline structure, then Step 802 may deposit PCMO, having a thickness of about 2000 Å, using a MOCVD process. Then, Step 804a writes a high resistance state, of greater than 300 k-ohms, in response to a pulse having an amplitude of 5 volts (V), or less, and a pulse duration of 1 ms, or less. Step 804b resets to a low resistance state, of less than 5 k-ohms, in response to a pulse having an amplitude of −5V, or greater, and a pulse duration of 1 ms, or less.

A PCMO device and associated fabrication methods have been presented that illustrate the relationship between crystalline structure and memory/switching characteristics. A few examples have been presented to clarify the invention. However, the invention is not limited to merely these examples. Other variations and embodiments of the invention will occur to those skilled in the art.

We claim:

1. A method for forming a $Pr_{0.3}Ca_{0.7}MnO_3$ (PCMO) thin film with crystalline structure-related memory resistance properties, the method comprising:
   depositing a PCMO thin film using a deposition process selected from a group consisting of a metal organic chemical vapor deposition (MOCVD) process, spin-coating, and MOCVD followed by spin-coating:
   forming a PCMO thin film with a first crystalline structure selected from a group including amorphous, weak-crystalline, and polycrystalline; and,
   changing the resistance state of the PCMO film using pulse polarities responsive to the first crystalline structure.

2. The method of claim 1 wherein forming a PCMO thin film with a first crystalline structure includes forming a PCMO thin film with a first crystalline structure selected from the group including amorphous and weak-crystalline; and,
   wherein changing the resistance state of the PCMO film using pulse polarities responsive to the first crystalline structure includes changing the resistance state of the PCMO film in response to unipolar pulses.

3. The method of claim 2 wherein changing the resistance state of the PCMO film in response to unipolar pulses includes:
   writing a high resistance state in response to a pulse having an amplitude in the range of 2 to 10 volts (V), and a pulse duration of in the range of 10 to 1000 nanoseconds (ns); and,
   resetting to a low resistance state in response to a pulse having an amplitude in the range of 2 to 5V, and a pulse duration in the range of 1.5 microseconds (μs) to 10 milliseconds (ms).

4. The method of claim 3 wherein writing a high resistance state includes writing a resistance in the range of about 60 kilo-ohms (k-ohms) to 10 megaohms; and,
   wherein resetting to a low resistance state includes resetting to a resistance in the range of about 0.5 to 50 k-ohms.

5. The method of claim 3 wherein forming a PCMO thin film with a first crystalline structure includes forming a PCMO film with an amorphous crystalline structure:
   wherein writing a high resistance state includes writing a resistance of greater than about 60 k-ohms, using a 5 V pulse of 100 ns: and,
   wherein resetting to a low resistance state includes resetting to a resistance of less than about 50 k-ohms, using a 3 V pulse of 10 μs.

6. The method of claim 4 wherein forming a PCMO thin film with a first crystalline structure includes forming a PCMO film with a weak-crystalline crystalline structure;
   wherein writing a high resistance state includes writing a resistance of greater than about 60 k-ohms, using a 5 V pulse of 100 ns: and,
   wherein resetting to a low resistance state includes resetting to a resistance of less than about 50 k-ohms using a 3 V pulse of 10 μs.

7. The method of claim 1 wherein depositing PCMO by MOCVD followed by spin-coating:
   MOCVD depositing a seed layer of PCMO having a thickness of about 200 Å; and,
   spin-coating a plurality of PCMO layers, having a combined thickness of about 2500 Å, overlying the seed layer.

8. The method of claim 1 wherein forming a PCMO thin film with a first crystalline structure includes forming a PCMO thin film with a polycrystalline crystalline structure; and,
   wherein changing the resistance state of the PCMO film using pulse polarities responsive to the first crystalline structure includes changing the resistance state of the PCMO film in response to bipolar pulses.

9. The method of claim 8 wherein changing the resistance state of the PCMO film in response to bipolar pulses includes:
   writing a high resistance state in response to a pulse having an amplitude of 5 volts (V), or less, and a pulse duration of 1 ms, or less: and,
   resetting to a low resistance state in response to a pulse having an amplitude of −5 V, or greater, and a pulse duration of 1 ms, or less.

10. The method of claim 9 wherein writing a high resistance state includes writing a resistance of greater than about 300 k-ohms; and,
   wherein resetting to a low resistance state includes resetting to a resistance of less than about 5 k-ohms.

11. The method of claim 10 wherein depositing a PCMO thin film includes depositing PCMO, having a thickness of about 2000 Å, using a MOCVD process.

12. A method for forming a $Pr_{0.3}Ca_{0.7}MnO_3$ (PCMO) thin film with crystalline structure-related memory resistance properties, the method comprising:

using a deposition process selected from a group consisting of a metal organic chemical vapor deposition (MOCVD) process, spin-coating, and MOCVD followed by spin-coating, forming a PCMO thin film with a crystalline structure;

in response to a PCMO crystalline structure selected from the group consisting of amorphous and weak-crystalline, using a unipolar pulse to change PCMO resistance states; and, in response to a PCMO polycrystalline structure, using a bipolar pulse to change PCMO resistance states.

* * * * *